US012720773B2

(12) United States Patent
Sung et al.

(10) Patent No.: US 12,720,773 B2

(45) Date of Patent: Aug. 25, 2026

(54) SEMICONDUCTOR PACKAGE

(71) Applicant: Samsung Electronics Co., Ltd., Suwon-si (KR)

(72) Inventors: Jaekyu Sung, Suwon-si (KR); Joonghyun Baek, Suwon-si (KR); Cheolwoo Lee, Suwon-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 397 days.

(21) Appl. No.: 18/453,611

(22) Filed: Aug. 22, 2023

(65) Prior Publication Data

US 2024/0179925 A1 May 30, 2024

(30) Foreign Application Priority Data

Nov. 25, 2022 (KR) ........................ 10-2022-0160588

(51) Int. Cl.

| | |
|---|---|
| ***H10B 80/00*** | (2026.01) |
| ***H10W 72/50*** | (2026.01) |
| ***H10W 72/90*** | (2026.01) |
| ***H10W 74/10*** | (2026.01) |
| ***H10W 90/00*** | (2026.01) |
| ***H10W 90/24*** | (2026.01) |
| *H10W 72/00* | (2026.01) |

(52) U.S. Cl.

CPC ............ *H10B 80/00* (2023.02); *H10W 90/00* (2026.01); *H10W 90/24* (2026.01); *H10W 72/07552* (2026.01); *H10W 72/527* (2026.01); *H10W 72/5445* (2026.01); *H10W 72/9445* (2026.01); *H10W 74/117* (2026.01); *H10W 90/752* (2026.01); *H10W 90/754* (2026.01)

(58) Field of Classification Search

CPC .... H10B 80/00; H10W 90/24; H10W 90/752; H10W 90/754

See application file for complete search history.

(56) References Cited

U.S. PATENT DOCUMENTS

| | | | | |
|---|---|---|---|---|
| 8,288,855 | B2 | 10/2012 | Nishiyama et al. | |
| 9,391,048 | B2 | 7/2016 | Lee | |
| 9,496,216 | B2 | 11/2016 | Chun et al. | |
| 9,899,347 | B1 | 2/2018 | Mostovoy et al. | |
| 10,249,592 | B2 | 4/2019 | Mostovoy et al. | |
| 2014/0167291 | A1 | 6/2014 | Nam et al. | |
| 2014/0252640 | A1 | 9/2014 | Kwak | |
| 2021/0318956 | A1 | 10/2021 | Keeth et al. | |
| 2022/0076712 | A1* | 3/2022 | Park | G11C 5/025 |

* cited by examiner

*Primary Examiner* — Daniel P Shook

(74) *Attorney, Agent, or Firm* — HARNESS, DICKEY & PIERCE, P.L.C.

(57) ABSTRACT

A semiconductor package may include a substrate; at least one controller chip on the substrate; at least one chip structure on the substrate, the at least one chip structure including a buffer chip, an upper chip stack on the buffer chip, and a lower chip stack below the buffer chip; an upper wire electrically connecting the upper chip stack, the buffer chip, and the at least one controller chip; a lower wire electrically connecting the lower chip stack and the at least one controller chip; a connection wire electrically connecting the at least one controller chip to the substrate; and connection bumps below the substrate, the connection bumps being electrically connected to the at least one controller chip and the at least one chip structure.

20 Claims, 16 Drawing Sheets

III1-III1'

IV2-IV2'

V1-V1'

SEMICONDUCTOR PACKAGE

CROSS-REFERENCE TO RELATED APPLICATION

This application claims the priority and benefit of Korean Patent Application No. 10-2022-0160588, filed on Nov. 25, 2022 in the Korean Intellectual Property Office, the entire contents of which are incorporated herein by reference.

BACKGROUND

1. Field

Inventive concepts relate to a semiconductor package.

2. Description of Related Art

Recently, there has been demand for high performance and high capacitance of semiconductor packages mounted on electronic devices. Accordingly, a semiconductor package including a plurality of semiconductor chips and having an improved input/output speed thereof has been developed.

SUMMARY

An aspect of inventive concepts is to provide a semiconductor package including a plurality of semiconductor chips and having an improved response speed.

According to an embodiment of inventive concepts, a semiconductor package may include a substrate including bonding pads; at least one controller chip on the substrate; at least one chip structure on the substrate and adjacent to the at least one controller chip; a bonding wire structure electrically connecting the substrate, the at least one controller chip, and the at least one chip structure; and an encapsulant encapsulating the at least one controller chip and the at least one chip structure. The at least one chip structure may include a buffer chip, an upper chip stack on an upper surface of the buffer chip, and a lower chip stack on a lower surface of the buffer chip. The lower surface of the buffer chip may be opposite the upper surface of the buffer chip. The buffer chip may include buffer pads on the upper surface of the buffer chip. The upper chip stack may include upper semiconductor chips with first connection pads. The lower chip stack may include lower semiconductor chips with second connection pads. The upper chip stack may be connected to the at least one controller chip via the buffer chip. The lower chip stack may be connected to the at least one controller chip via the substrate.

According to an embodiment of inventive concepts, a semiconductor package may include a substrate; at least one controller chip on the substrate; at least one chip structure on the substrate, the at least one chip structure including a buffer chip, an upper chip stack on the buffer chip, and a lower chip stack below the buffer chip; an upper wire electrically connecting the upper chip stack, the buffer chip, and the at least one controller chip; a lower wire electrically connecting the lower chip stack and the at least one controller chip; a connection wire electrically connecting the at least one controller chip to the substrate; and connection bumps below the substrate, the connection bumps being electrically connected to the at least one controller chip and the at least one chip structure.

According to an embodiment of inventive concepts, a semiconductor package may include a substrate; at least one controller chip on the substrate; at least one chip structure on the substrate, the at least one chip structure including a buffer chip, an upper chip stack on the buffer chip, and a lower chip stack below the buffer chip; an upper wire electrically connecting the upper chip stack, the buffer chip, and the at least one controller chip, the upper wire including a long wire directly connecting the buffer chip and the at least one controller chip; and a lower wire electrically connecting the lower chip stack and the at least one controller chip.

BRIEF DESCRIPTION OF DRAWINGS

The above and other aspects, features, and advantages of inventive concepts will be more clearly understood from the following detailed description taken in conjunction with the accompanying drawings, in which.

DETAILED DESCRIPTION

Hereinafter, example embodiments of inventive concepts will be described with reference to the accompanying drawings as follows.

Figure 1:
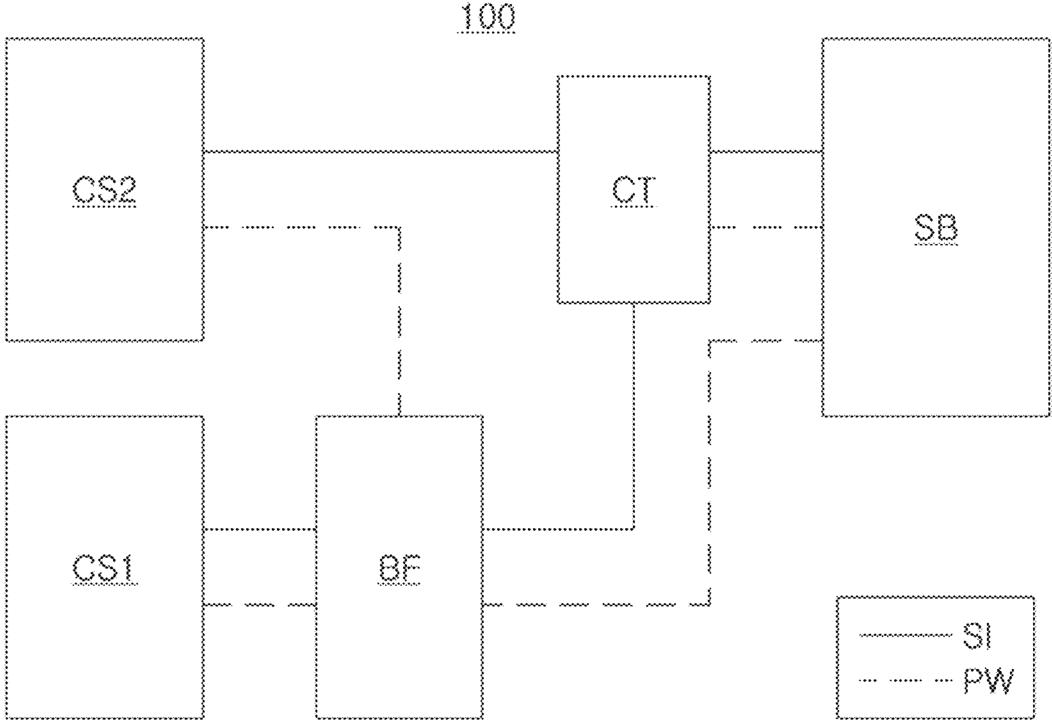
FIG. 1 is a diagram schematically illustrating an electrical connection relationship in a semiconductor package according to an example embodiment of inventive concepts.

FIG. 1 is a diagram schematically illustrating an electrical connection relationship within a semiconductor package 100 according to an example embodiment of inventive concepts.

Referring to FIG. 1, a semiconductor package 100 according to an example embodiment may include a first chip stack CS1, a second chip stack CS2, a buffer BF, a controller CT, and an external connection portion SB.

The first chip stack CS1 and the second chip stack CS2 may include a memory chip, for example, a volatile memory semiconductor chip such as a DRAM or a non-volatile memory semiconductor chip such as a flash memory. The first chip stack CS1 and the second chip stack CS2 are connected to each other through the controller CT, and may form one or more channels communicating externally. For example, the first chip stack CS1 and the second chip stack CS2 may form one channel. The first chip stack CS1 and the second chip stack CS2 may be connected to the buffer BF, the controller CT, and/or the external connection portion SB through a signal path S1 and a power/ground path PW.

The buffer BF may be connected to one of the first chip stack CS1 and the second chip stack CS2 through the signal path S1. For example, the buffer BF may include a buffer circuit for controlling loading of the first chip stack CS1.

The controller CT may be a memory controller and may determine a data processing sequence of the first chip stack CS1 and the second chip stack CS2 and limiting and/or preventing errors and bad sectors.

The external connection portion SB may transfer signals and/or data of the first chip stack CS1 and the second chip stack CS2 received through the controller CT to an external device (not shown) (e.g., a controller chip), or receive command and address signals from an external device (not shown).

One of the first chip stack CS1 and the second chip stack CS2 may be connected to the controller CT via the buffer BF, and the other one thereof may be directly connected to the controller CT.

In embodiments of inventive concepts, by connecting a first chip stack CS1 disposed relatively far from the controller CT to the controller CT via the buffer BF, and connecting a second chip stack CS2 disposed adjacently to the controller CT, signal skewness of the first chip stack CS1 and the second chip stack CS2 may be reduced, and a response speed may be improved. For example, the first chip stack CS1 may be sequentially connected to the buffer BF and the controller CT via the signal path S1, and the second chip stack CS2 may be directly connected to the controller CT via the signal path S1.

The first chip stack CS1, the second chip stack CS2, the buffer BF, and the controller CT may be connected to the external connection portion SB via a power/ground path PW. The power/ground path PW may provide a power voltage and/or a ground voltage to the first chip stack CS1, the second chip stack CS2, the buffer BF, and the controller CTs. In the drawing, it is illustrated that the power/ground path PW connected to the controller CT and the power/ground path PW connected to the first chip stack CS1, the second chip stack CS2, and the buffers BF are separated, but according to example embodiments, the power/ground path PW may be merged into one.

Figure 2A:
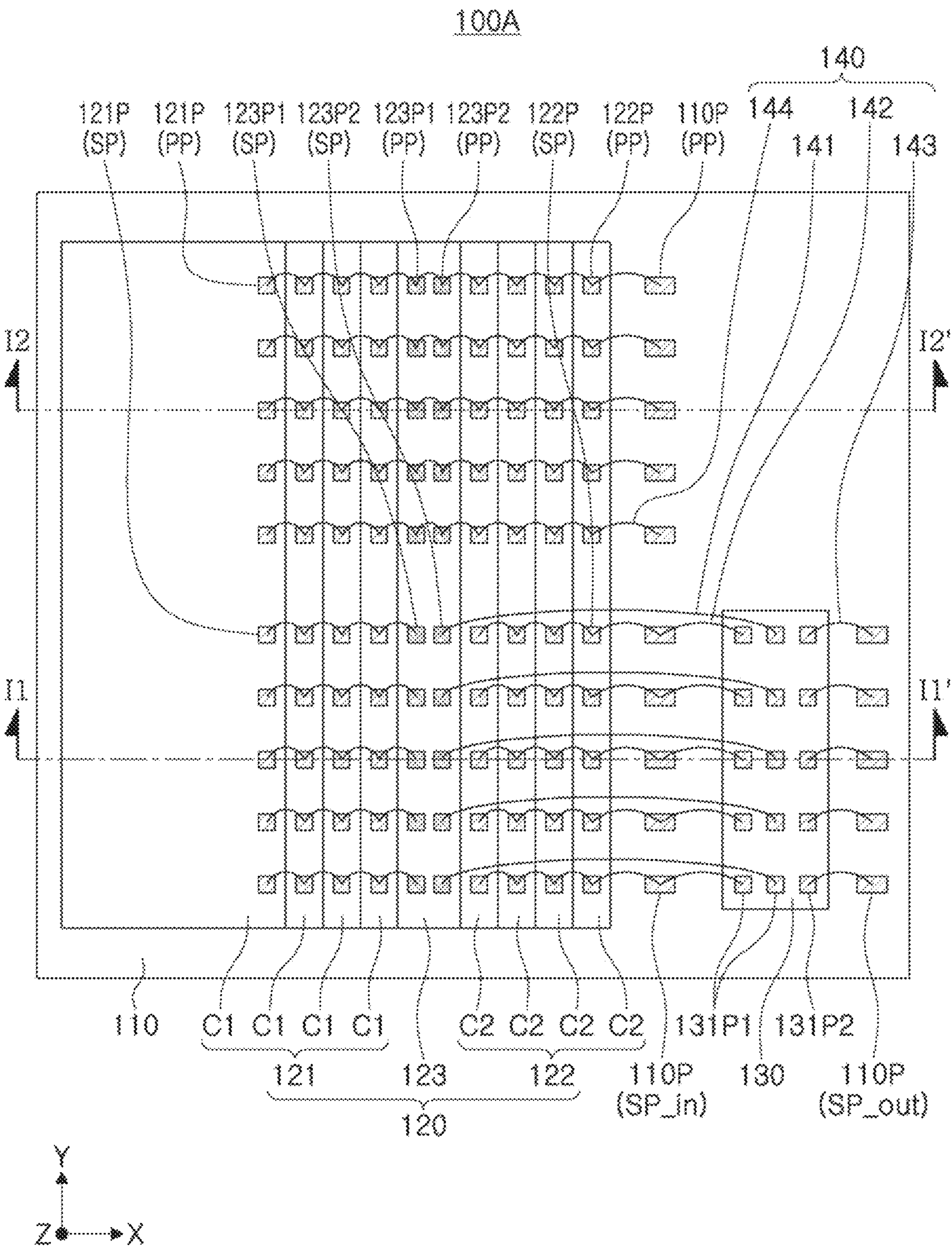
FIG. 2A is a plan view illustrating a semiconductor package according to an example embodiment.
Figure 2B:
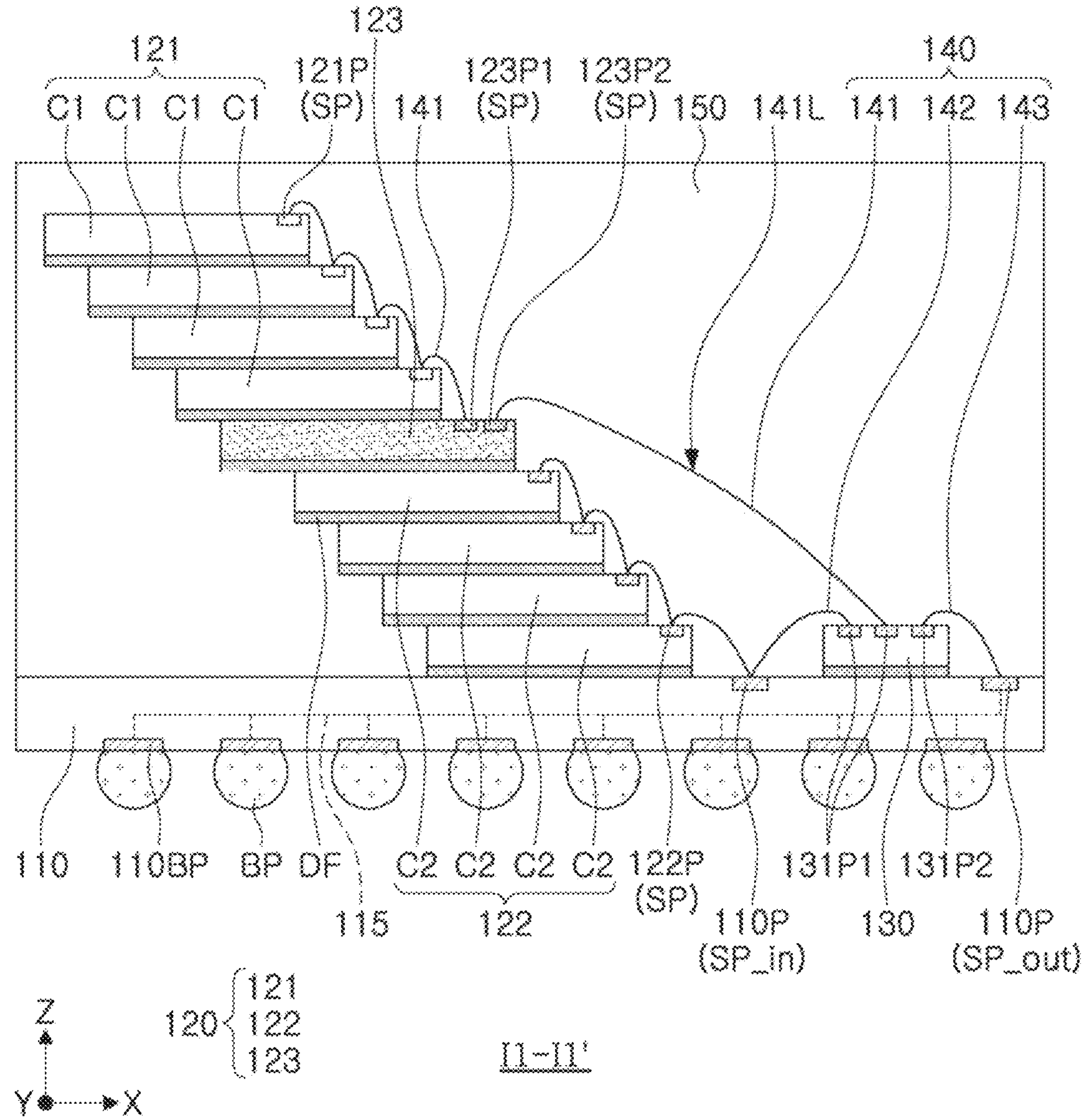
FIG. 2B is a cross-sectional view taken along line I1-I1' of FIG. 2A.
Figure 2C:
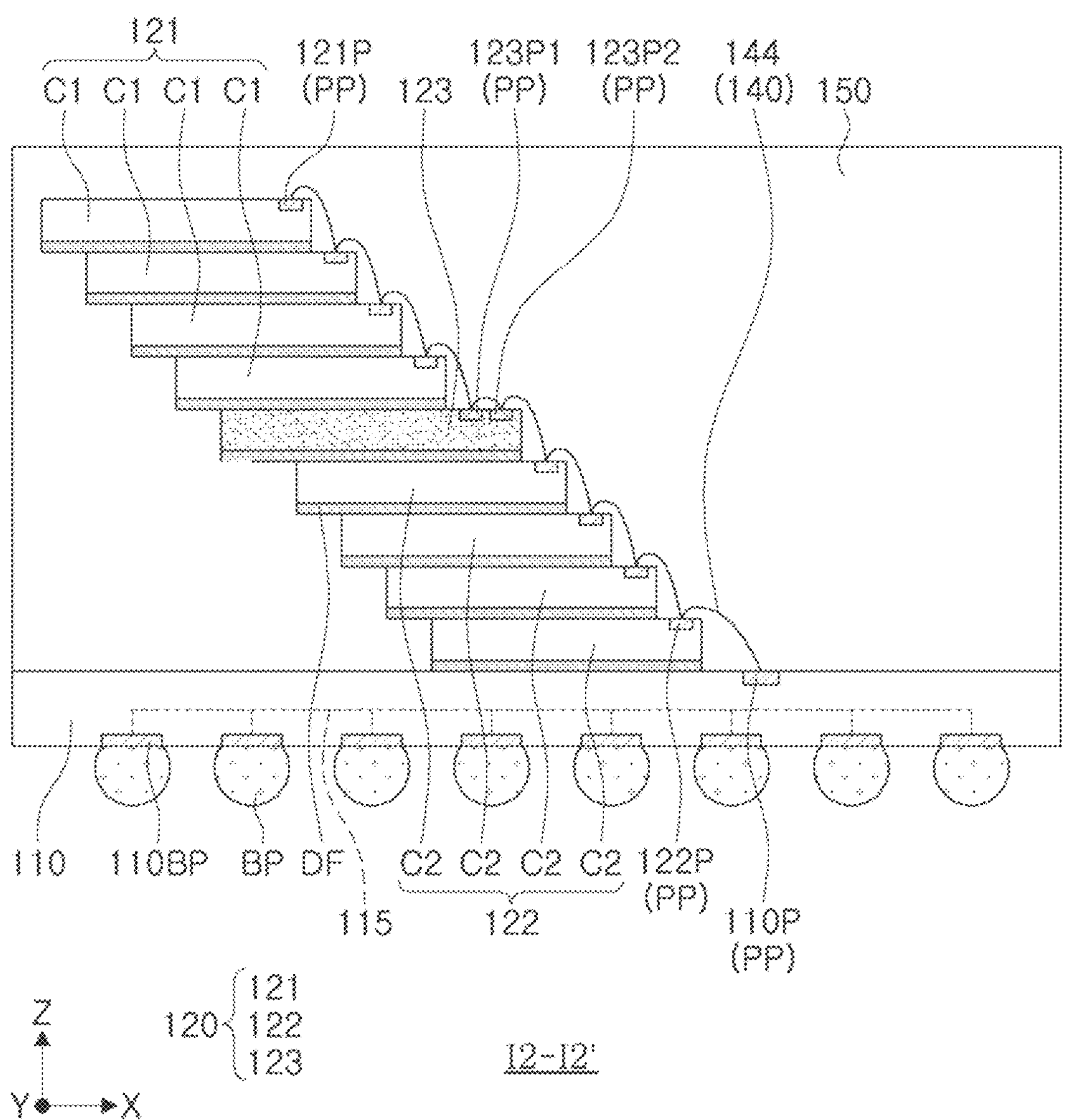
FIG. 2C is a cross-sectional view taken along line 12-12' of FIG. 2A.

FIG. 2A is a plan view illustrating a semiconductor package 100A according to an example embodiment, FIG. 2B is a cross-sectional view taken along line I1-I1' of FIG. 2A, and FIG. 2C is a cross-sectional view taken along line 12-12' of FIG. 2A.

Referring to FIGS. 2A to 2C, the semiconductor package 100A according to an example embodiment may include a substrate 110, at least one chip structure 120, at least one controller chip 130, and a bonding wire structure 140. In addition, the semiconductor package 100A may further include an encapsulant 150 for encapsulating at least one controller chip 130 and at least one chip structure 120 on the substrate 110. The encapsulant 150 may protect the chip structure 120 and the controller chip 130 from external environments such as physical shock or moisture. The encapsulant 150 may be formed by curing, for example, an epoxy molding compound (EMC).

According to an embodiment of inventive concepts, a buffer chip 123 may be disposed between upper semiconductor chips C1, positioned in a relatively high position, among a plurality of semiconductor chips C1 and C2 constituting the chip structure 120, and the controller chip 130, so that signal skewness between the upper semiconductor chips C1 and the lower semiconductor chips C2 may be reduced and a response speed may be improved. Accordingly, the buffer chip 123 may be positioned on a level higher than that of at least one controller chip 130.

For example, the chip structure 120 may include an upper chip stack 121, stacked on the buffer chip 123 and a lower chip stack 122, stacked below the buffer chip 123, where the upper chip stack 122 may be connected to the controller chip 130 by the buffer chip 123, and the lower chip stack 122 may be connected to the controller chip 130 without passing through the buffer chip 123.

For example, the bonding wire structures 140 may include an upper wire 141 connected to the upper chip stack 121 and a lower wire 142 connected to the lower chip stack 122. The upper wire 141 may electrically connect the upper chip stack 121, the buffer chip 123, and at least one controller chip 130, and include a long wire 141L directly connecting the buffer chip 123 to at least one controller chip 130. The lower wire 142 may electrically connect the lower chip stack 122 and at least one controller chip 130. Depending on the example embodiment, the lower wire 142 may directly connect the lower chip stack 122 to the chip structure 120 or may connect the lower chip stack 122 to the chip structure 120 by a bonding pad 110P of the substrate 110. The upper wire 141 and the lower wire 142 may be electrically insulated from each other. That is, since loading of the upper chip stack 121 and the lower chip stack 122 are separated, the response speed can be improved.

Hereinafter, each component of the semiconductor package 100A will be described in detail.

The substrate 110 may be a substrate for a semiconductor package including a printed circuit board (PCB), a ceramic substrate, a glass substrate, a tape wiring board, and the like. For example, the substrate 110 may be a double-sided printed circuit board (PCB) or a multilayer printed circuit board (multilayer PCB).

The substrate 110 may include bonding pads 110P, bump pads 110BP, and an interconnection circuit 115 electrically connecting the same. The bonding pads 110P may be disposed on an upper surface of the substrate 110, and the bump pads 110BP may be disposed on a lower surface of the substrate 110. The bonding pads 110P and the bump pads 110BP may include at least one metal of copper (Cu), aluminum (Al), nickel (Ni), silver (Ag), gold (Au), platinum (Pt), tin (Sn), or lead. (Pb), titanium (Ti), chromium (Cr), palladium (Pd), indium (In), zinc (Zn), and carbon (C) or an alloy composed of two or more metals thereof.

The bonding pads 110P may be arranged adjacent to at least one chip structure 120 and at least one controller chip 130. The bonding pads 110P may include a signal input pad SP_in, a signal output pad SP_out, and a power/ground pad PP. The signal input pad SP_in may be connected to the signal input pad 131P1 of the at least one controller chip 130, and the signal output pad SP_out may be connected to the signal output pad 131P2 of the at least one controller chip 130. In order to clearly illustrate the characteristics of inventive concepts, a connection relationship between at least one controller chip 130 and the power/ground pad PP is not shown, but the controller chip 130 may further include a connection terminal (not shown) connected to the power/ground pad PP.

Connection bumps BP may be disposed below the bump pads 110BP. The connection bumps BP may be electrically connected to at least one controller chip 130 and at least one chip structure 120 by an interconnection circuit 115. The connection bumps BP may include, for example, tin (Sn) or an alloy containing tin (Sn) (e.g., Sn—Ag—Cu). The connection bumps BP may be electrically connected to external devices such as a module substrate, a system board, and the like.

At least one chip structure 120 may be disposed on an upper surface of the substrate 110, and may include an upper chip stack 121, a lower chip stack 122, and a buffer chip 123. The upper chip stack 121 may be disposed on an upper surface of the buffer chip 123, and may include a plurality of upper semiconductor chips C1 stacked vertically. The plurality of upper semiconductor chips C1 may be stacked to be offset in a horizontal direction (e.g., X-direction) such that respective first connection pads 121P is exposed in a vertical direction (Z-direction). The lower chip stack 122 may be disposed on a lower surface of the buffer chip 123, and may include a plurality of lower semiconductor chips C2 stacked vertically. The plurality of lower semiconductor chips C2 may be stacked to be offset in a horizontal direction (e.g., X-direction) such that respective second connection pads 122P is exposed in a vertical direction (Z-direction). The buffer chip 123 may be disposed between the upper chip stack 121 and the lower chip stack 122, and may have an upper surface on which buffer pads 123P1 and 123P2 are disposed and a lower surface opposite thereto.

The first connection pads 121P, the second connection pads 122P, and the buffer pads 123P1 and 123P2 may include a signal pad SP and a power/ground pad PP. The first connection pad 121P may be connected to the controller chip 130 by the buffer chip 123. For example, the signal pad SP of the first connection pads 121P may be connected to at least one controller chip 130 by the signal pad SP of the buffer chip 123 by the upper wire 141. The second connection pads 122P may be connected to at least one controller chip 130 without passing through the buffer chip 123. For example, the signal pad SP of the second connection pads 122P may be connected to at least one controller chip 130 by a signal input pad SP_in of a bonding pad 110P by the lower wire 142. Depending on the example embodiment, the signal pad SP of the second connection pads 122P may be connected to at least one controller chip 130 without passing through the signal input pad SP_in of the bonding pad 110P. A power/ground pad PP of the first connection pads 121P, a power/ground pad PP of the second connection pads 122P, and a power/ground pad PP of the buffer pads 123P1 and 123P2 may be connected to a power/ground pad PP of the substrate 110 by the second connection wire 144.

In an example embodiment, the buffer pads 123P1 and 123P2 may be arranged on a first side surface of the buffer chip 123. For example, the buffer pads 123P1 and 123P2 may include a first buffer pad 123P1, adjacent to the upper chip stack 121 and a second buffer pad 123P2, adjacent to the lower chip stack 122. The first buffer pad 123P1 and the second buffer pad 123P2 may be electrically connected to each other by a buffer circuit. The first buffer pad 123P1 may be an input terminal, and the second buffer pad 123P2 may be an output terminal. The upper semiconductor chips 121 may be stacked such that the first connection pads 121P are adjacent to a first side of the buffer chip 123, and the buffer pads 123P1 and 123P2 and the first connection pads 121P are exposed upwardly. The lower semiconductor chips 122 may be stacked such that the second connection pads 122P are adjacent to a first side of the buffer chip 123 and the second connection pads 122P are exposed upwardly. In addition, at least one controller chip 130 may be disposed on the substrate 110 adjacent to the first side of the buffer chip 123. However, a dispositional direction, a stacked shape, and the like, of the upper semiconductor chips 121, the lower semiconductor chips 122, and at least one controller chip 130 are not particularly limited.

The upper semiconductor chips 121 and the lower semiconductor chips 122 may include the same type of semiconductor chips. For example, the upper semiconductor chips 121 and the lower semiconductor chips 122 may include a non-volatile memory semiconductor chip such as flash memory, phase-change random access memory (PRAM), magnetic random access memory (MRAM), ferroelectric random access memory (FeRAM), or resistive random access memory (RRAM), and/or a volatile memory semiconductor chip such as dynamic random access memory (DRAM) or static random access memory (SRAM).

At least one controller chip 130 may be disposed adjacently to the corresponding at least one chip structure 120, and may include a plurality of pads 131P1 and 131P2 connected to the bonding wire structure 140. The plurality of pads 131P1 and 131P2 may include signal input pads 131P1 and signal output pads 131P2. The at least one controller chip 130 may be configured to divide and load the upper chip stack 121 and the lower chip stack 122, thereby improving a loading speed. For example, among the signal input pads 131P1, pads connected to the upper chip stack 121 and pads connected to the lower chip stack 122 may be physically separated. The signal output pads 131P2 may be connected to the bonding pads 110P of the substrate 110. In order to illustrate a connection relationship between the signal pad SP of the first connection pads 121P, the second connection pads 122P, and the buffer pads 123P1 and 123P2 and the controller chip 130, although power and ground terminals of at least one controller chip 130 are not illustrated, the controller chip 130 may further include power and ground connection terminals (not shown) connected to the power/ground pad PP of the substrate 110. The at least one controller chip 130 may include a control circuit configured to determine data processing sequences of the upper semiconductor chips 121 and the lower semiconductor chips 122, and to limit and/or prevent errors and bad sectors.

The bonding wire structure 140 may electrically connect a substrate 110, at least one controller chip 130, and at least one chip structure 120. The bonding wire structure 140 may include an upper wire 141, a lower wire 142, a first connection wire 143, and a second connection wire 144.

The upper wire 141 may electrically connect an upper chip stack 121, a buffer chip 123, and at least one controller chip 130. For example, the upper wire 141 may include a first portion connecting the signal pad SP of the first connection pads 121P, adjacent to each other, of the upper chip stack, to the first buffer pad 123P1, and a second portion connecting the second buffer pad 123P2 to the at least one controller chip 130. The upper wire 141 may include a long wire 141L (the 'second portion') directly connecting the buffer chip 123 to at least one controller chip 130.

The lower wire 142 may electrically connect the lower chip stack 122 to at least one controller chip 130. For example, the lower wire 142 may include a signal pad SP of the second connection pads 122P, adjacent to each other, of the lower chip stack 122, and a signal input pad (SP_in) of the bonding pads 110P of the substrate 110, and at least one controller chip 130. The lower wire 142 may be electrically insulated from the buffer chip 130 on the lower chip stack 122. In embodiments of inventive concepts, by connecting an upper chip stack 121, located at a relatively high place to the controller chip 130 by the buffer chip 123, signal skewness between the lower chip stack 122 and the upper chip stack 121 may be reduced, and a response speed may be improved.

The first connection wire 143 may electrically connect at least one controller chip 130 to the substrate 110. For example, the first connection wire 143 may connect a signal output pad 131P2 of the at least one controller chip 130 to the signal output pad SP_out of the substrate 110.

The second connection wire 144 may electrically connect the upper chip stack 121, the lower chip stack 122, and the buffer chip 123 to the substrate 110. For example, the second connection wire 144 may connect a power/ground pad PP of the first connection pads 121P, adjacent to each other, of the upper chip stack 121, a power/ground pad PP of the buffer pads 123P1 and 123P2, a power/ground pad PP of the second connection pads 122P, adjacent to each other, of the lower chip stack 122, and a power/ground pad PP of the substrate 110. Depending on the example embodiment, the second connection wire 144 may be connected to only either one of the power/ground pad PP of the first buffer pads 123P1 and the power/ground pad PP of the second buffer pad 123P2.

Figure 3A:
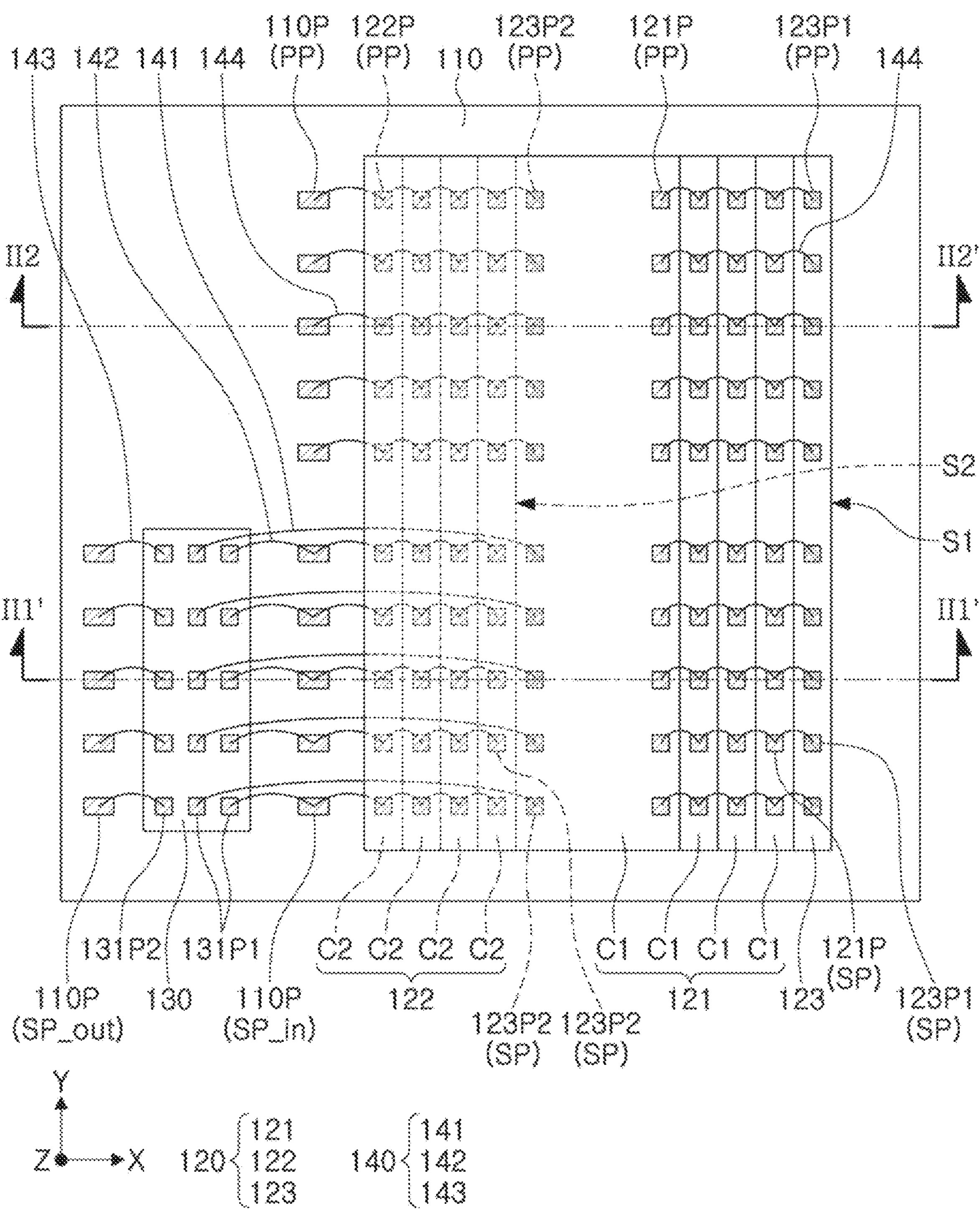
FIG. 3A is a cross-sectional view of a semiconductor package according to an example embodiment.
Figure 3B:
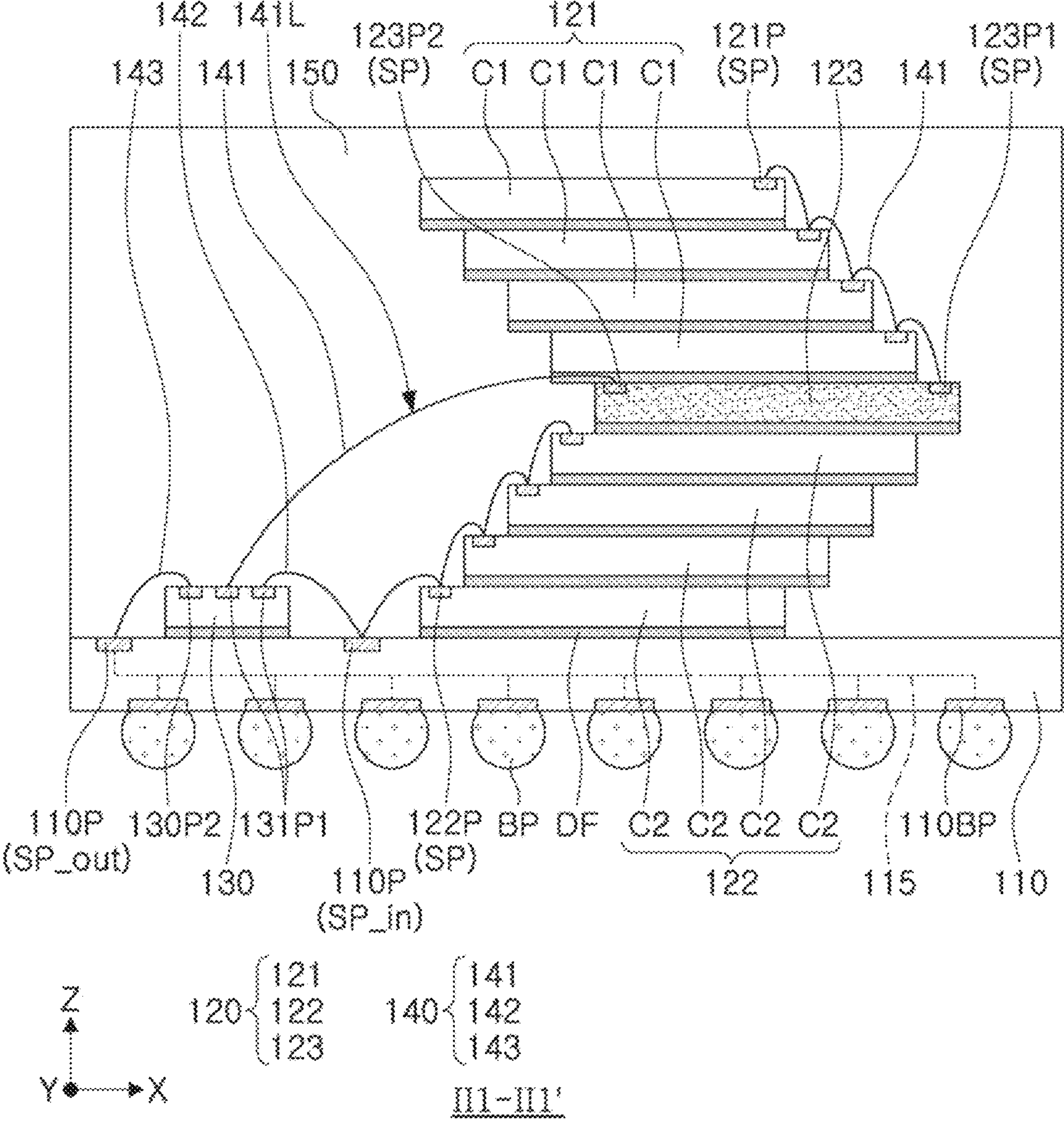
FIG. 3B is a cross-sectional view taken along line II1-II1' of FIG. 3A.
Figure 3C:
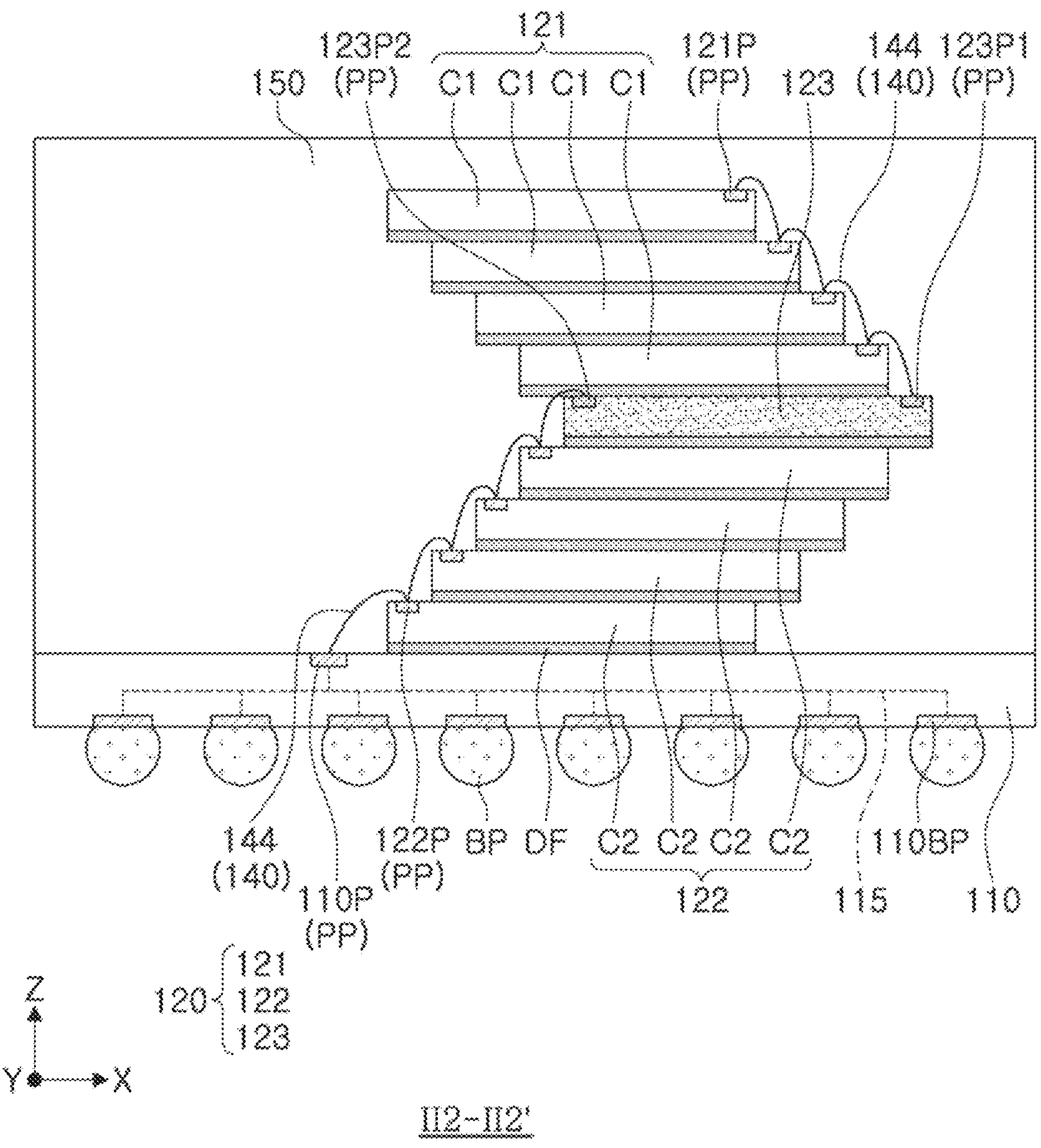
FIG. 3C is a cross-sectional view taken along line II2-II2' of FIG. 3A.

FIG. 3A is a cross-sectional view of a semiconductor package 100B according to an example embodiment of inventive concepts, FIG. 3B is a cross-sectional view taken along line II1-II1' of FIG. 3A, and FIG. 3C is a cross-sectional view taken along line II2-II2' of FIG. 3A.

Referring to FIGS. 3A to 3C, the semiconductor package 100B of an example embodiment may have the same or similar features to those described with reference to FIGS. 1 to 2C, except that a stacked form of the chip stacks 121 and 122 is modified.

In this embodiment, upper semiconductor chips C1 and lower semiconductor chips C2 may be disposed such that connection pads 121P and 122P face opposite directions. The buffer chip 123 may include first buffer pads 123P1 arranged on a first side S1 and second buffer pads 123P2 arranged on a second side S2 opposite to the first side S1, and electrically connected to 123P1. The upper semiconductor chips C1 may be stacked so that the first connection pads 121P are adjacent to the first side S1 of the buffer chip 123, and the first buffer pads 123P1 and the first connection pads 121P are exposed upwardly. The lower semiconductor chips C2 may be stacked so that the second connection pads 122P are adjacent to the second side S2 of the buffer chip 123, and the second connection pads 122P are exposed upwardly.

At least one controller chip 130 may be disposed adjacently to the second side S2 of the buffer chip 123, but an example embodiment thereof is not limited thereto.

An upper wire 141 may electrically connect a signal pad SP of the first connection pads 121P, adjacent to each other, a signal pad SP of the first buffer pads 123P1, a signal pad SP of the second buffer pads 123P2, and at least one controller chip 130.

A lower wire 142 may connect a signal pad SP of the second connection pads 122P, adjacent to each other, of the lower chip stack 122, a signal input pad SP_in of the bonding pads 110P of the substrate 110, and at least one controller chip 130.

A first connection wire 143 may electrically connect at least one controller chip 130 to the substrate 110. For example, the first connection wire 143 may connect a signal output pad 131P2 of the at least one controller chip 130 to a signal output pad SP_out of the substrate 110.

A second connection wire 144 may electrically connect the upper chip stack 121, the lower chip stack 122, and the buffer chip 123 to the substrate 110. For example, the second connection wire 144 may connect a power/ground pad PP of the first connection pads 121P, adjacent to each other, of the upper chip stack 121, a power/ground pad PP of the first and second buffer pads 123P1 and 123P2, a power/ground pad PP of the second connection pads 122P, adjacent to each other, of the lower chip stack 122, and a power/ground pad PP of the substrate 110.

Figure 4A:
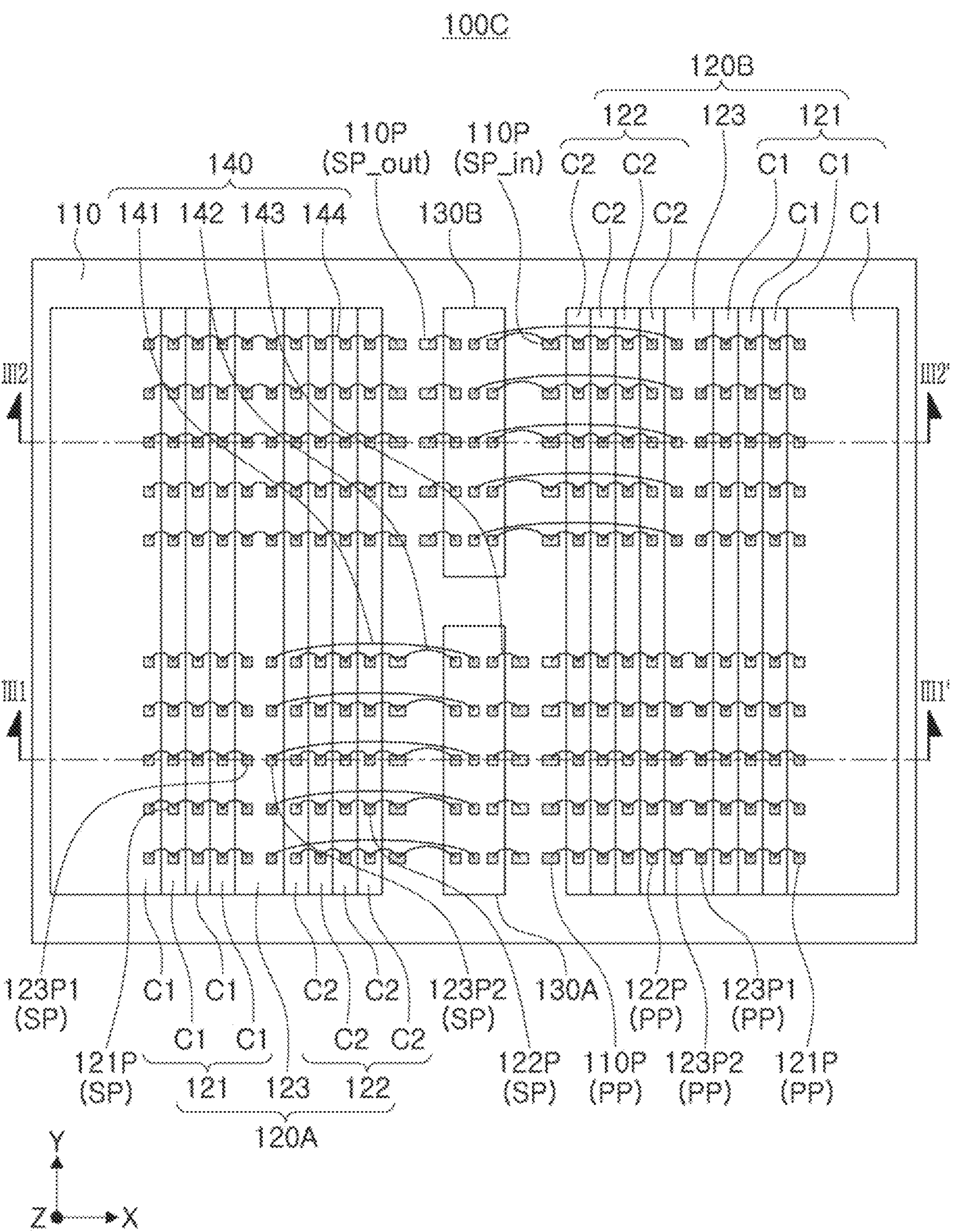
FIG. 4A is a cross-sectional view of a semiconductor package according to an example embodiment.
Figure 4B:
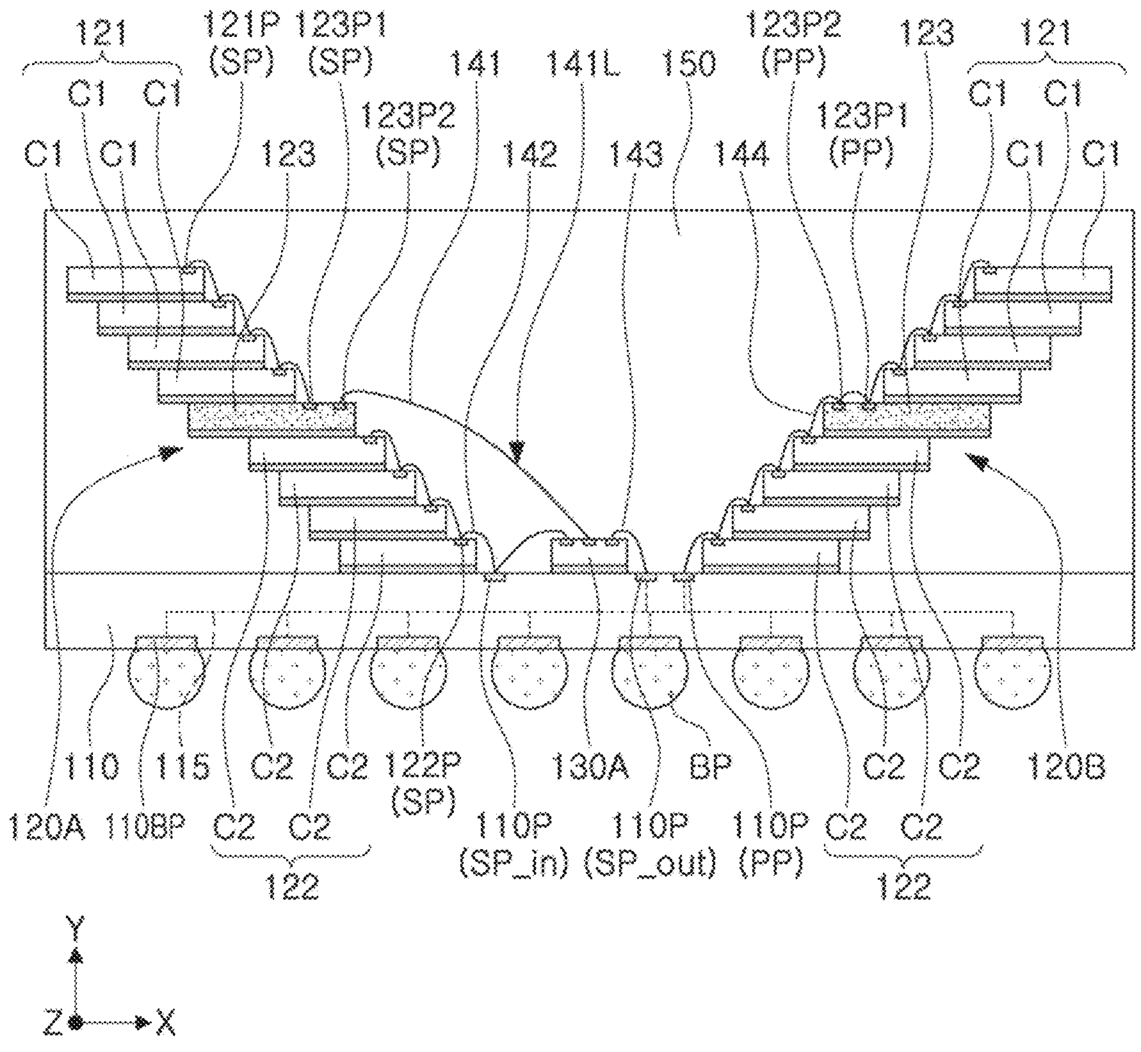
FIG. 4B is a cross-sectional view taken along line III1-III1' of FIG. 4A.
Figure 4C:
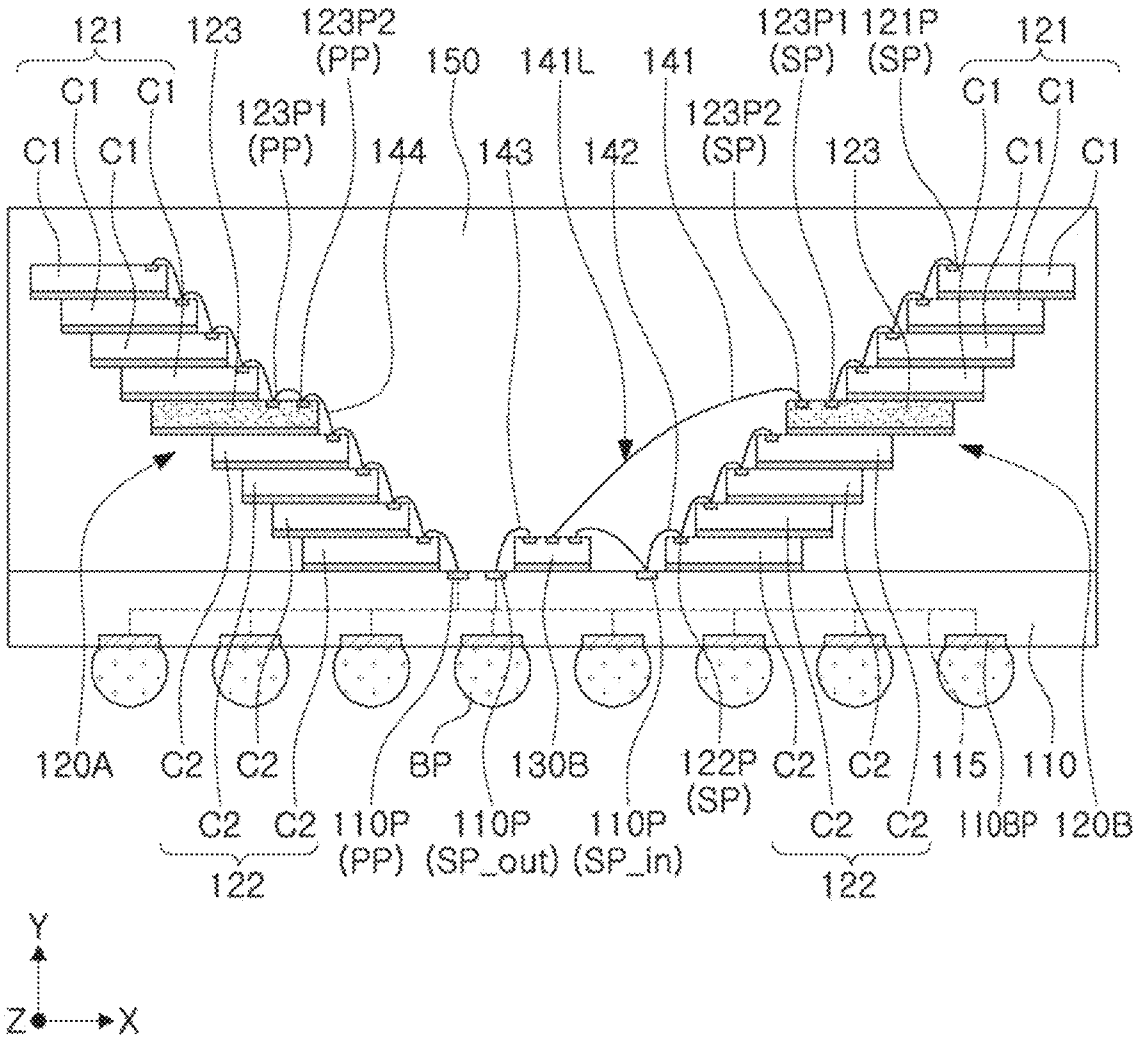
FIG. 4C is a cross-sectional view taken along line III2-III2' of FIG. 4A.

FIG. 4A is a cross-sectional view of a semiconductor package 100C according to an example embodiment of inventive concepts, FIG. 4B is a cross-sectional view taken along line III1-III1' of FIG. 4A, and FIG. 4C is a cross-sectional view taken along line III2-III2' of FIG. 4A.

Referring to FIGS. 4A to 4C, the semiconductor package 100C of an example embodiment may have the same or similar features as those described with reference to FIGS. 1 to 3C, except for including a plurality of chip structures 120A and 120B and a plurality of controller chips 130A and 130B.

The semiconductor package 100C of the present example embodiment may include a first chip structure 120A and a second chip structure 120B arranged horizontally (e.g., in an X-direction) on a substrate 110. In addition, the semiconductor chip 100C may include a first controller chip 130A and a second controller chip 130B respectively corresponding to the first chip structure 120A and the second chip structure 120B.

The first chip structure 120A and the second chip structure 120B may be disposed spaced apart from each other on the substrate 110, and the first controller chip 130A and the second controller chip 130B may be disposed between the first chip structure 120A the second chip structure 120B. The first chip structure 120A and the second chip structure 120B may be stacked in such a manner that a separation distance between lower semiconductor chips C2 and upper semiconductor chips C1, corresponding thereto, increases in an upward direction in a horizontal direction. Depending on the example embodiment, a stacked shape (e.g., 'V' shape) of the first chip structure 120A and the second chip structure 120B may be variously modified.

The first chip structure 120A and the second chip structure 120B may include an upper chip stack 121, a lower chip stack 122, and a buffer chip 12, respectively. Since the upper chip stack 121, the lower chip stack 122, and the buffer chip 123 have features similar to those described with reference to FIGS. 2A to 2C, overlapping descriptions are omitted. The first chip structure 120A and the second chip structure 120B may be connected to the first controller chip 130A and the second controller chip 130B by a bonding wire structure 140, respectively. The first chip structure 120A and the second chip structure 120B may form an independent channel, respectively. The first controller 130A may include a control circuit for the first chip structure 120A, and the second controller 130B may include a control circuit for the second chip structure 120B.

Figure 5A:
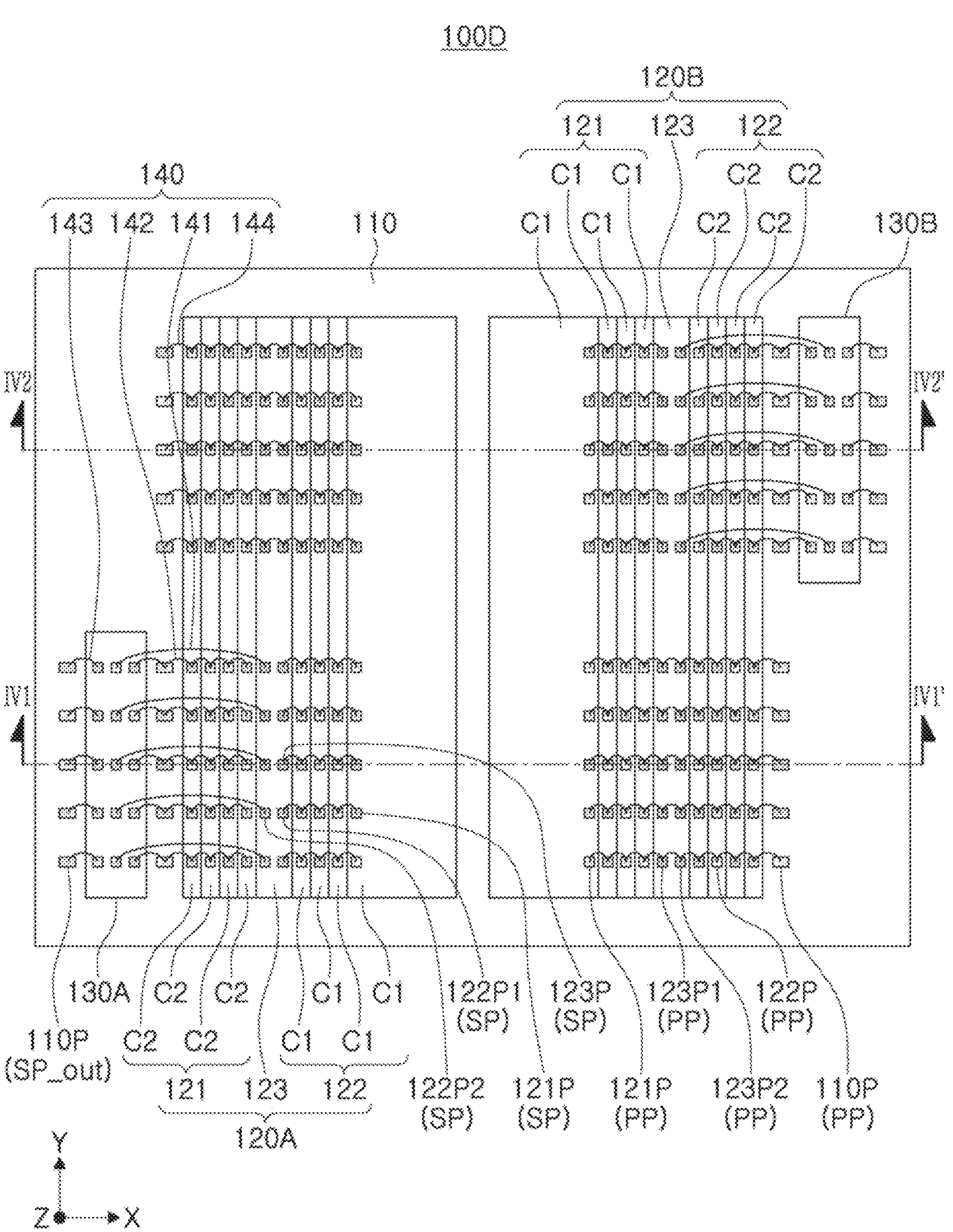
FIG. 5A is a cross-sectional view of a semiconductor package according to an example embodiment.
Figure 5B:
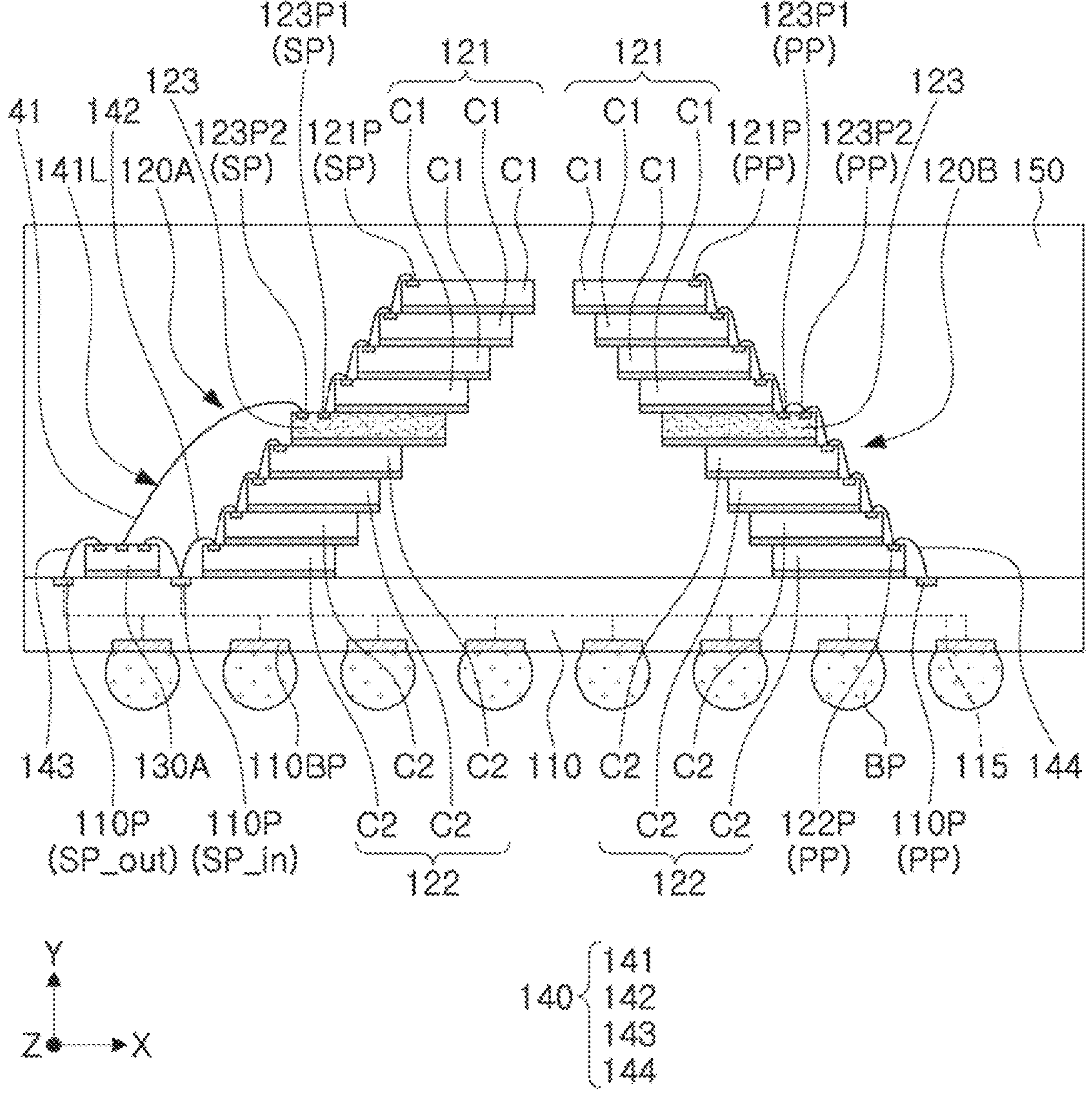
FIG. 5B is a cross-sectional view taken along line IV1-IV1' of FIG. 5A.
Figure 5C:
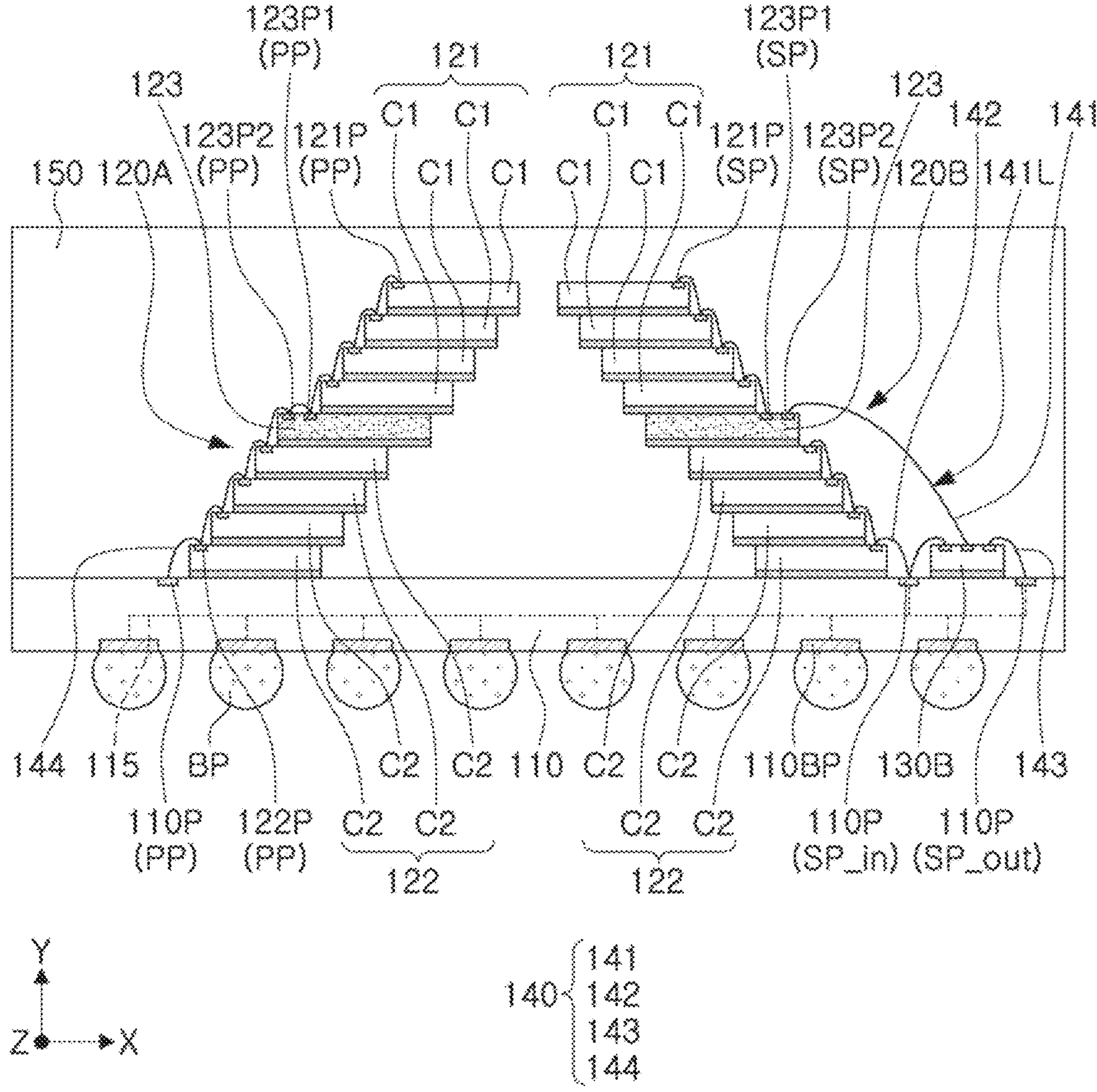
FIG. 5C is a cross-sectional view taken along line IV2-IV2' of FIG. 5A.

FIG. 5A is a cross-sectional view of a semiconductor package 100D according to an example embodiment of inventive concepts, FIG. 5B is a cross-sectional view taken along line IV1-IV1' of FIG. 5A, and FIG. 5C is a cross-sectional view taken along line IV2-IV2' of FIG. 5A.

Referring to FIGS. 5A to 5C, a semiconductor package 100D according to an example embodiment may have the same or similar features as those described with reference to FIGS. 4A to 4C, except that the semiconductor package 100D includes a plurality of chip structures 120A and 120B and a plurality of controller chips 130A and 130B, but a disposition of the plurality of chip structures 120A and 120B and the plurality of controller chips 130A and 130B is different from the example embodiment illustrated in FIGS. 4A to 4C.

In the present embodiment, the first chip structure 120A and the second chip structure 120B may be disposed on the substrate 110 such that the connection pads 121P and 122P face opposite to each other, and the first controller chip 130A and the second controller chip 130B may be disposed adjacently to the first chip structure 120A and the second chip structure 120B, respectively. For example, the first chip structure 120A may be disposed between one side of the substrate 110 and the first chip structure 120A, and the second chip structure 120B may be disposed between the other side of the substrate 110 and the second chip structure 120B. The first chip structure 120A and the second chip structure 120B may be stacked so that a separation distance between the lower semiconductor chips and the upper semiconductor chips C1, corresponding to each other, in a horizontal direction decreases upwardly (e.g., 'A' shape). As described above, a dispositional shape of the first chip structure 120A, the second chip structure 120B, the first controller chip 130A, and the second controller chip 130B may be variously modified.

Figure 6A:
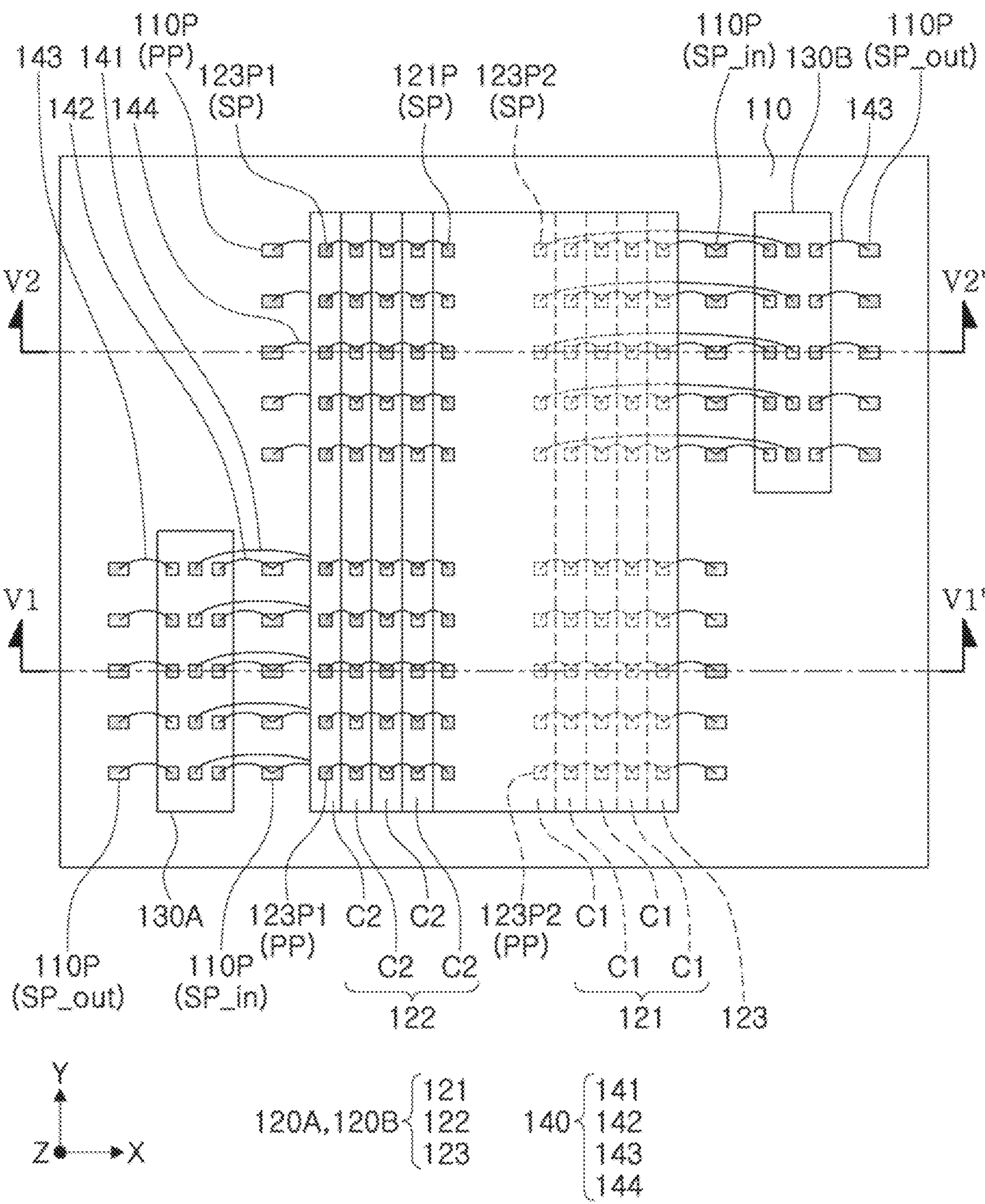
FIG. 6A is a cross-sectional view of a semiconductor package according to an example embodiment.
Figure 6B:
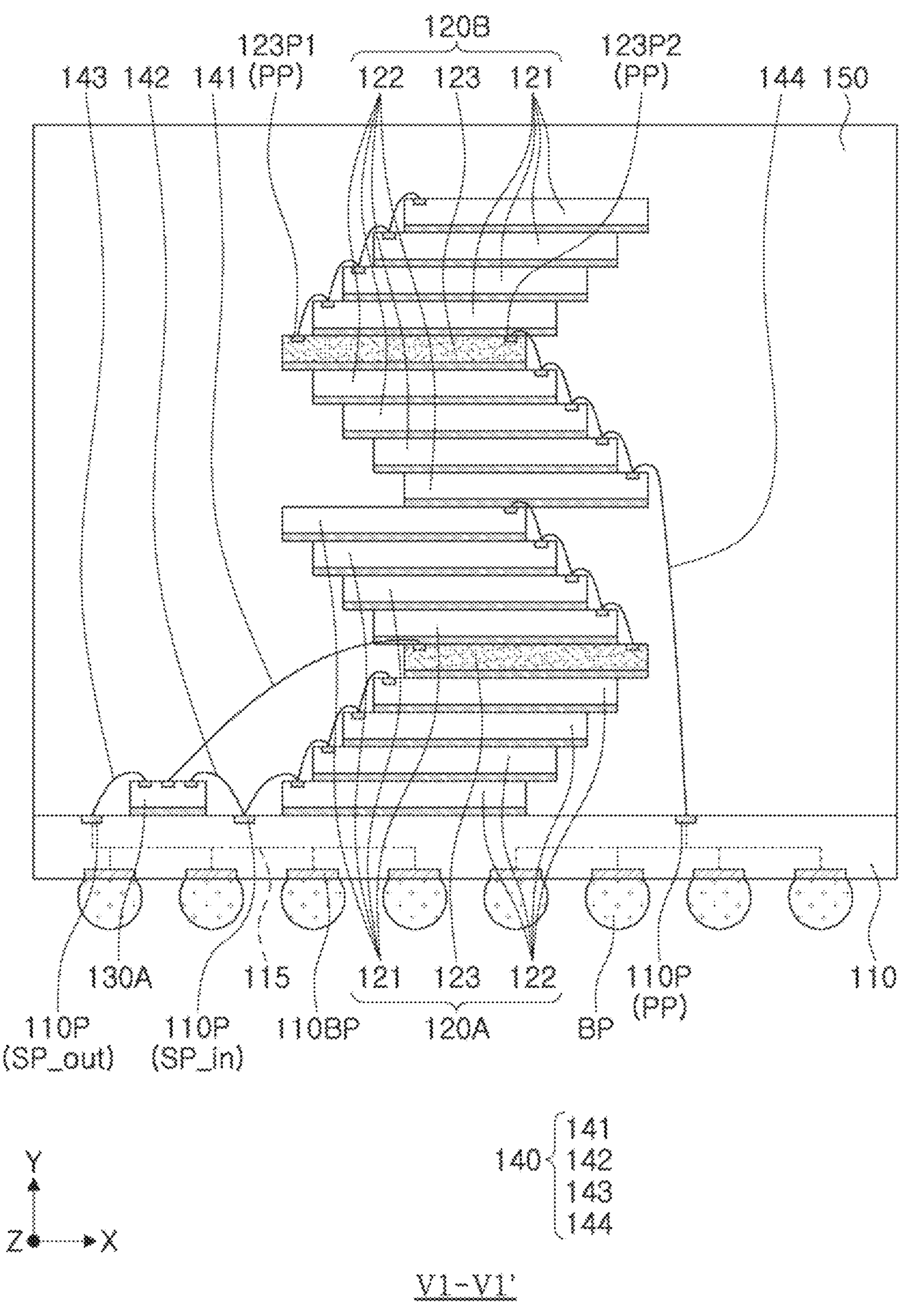
FIG. 6B is a cross-sectional view taken along line V1-V1' of FIG. 6A.
Figure 6C:
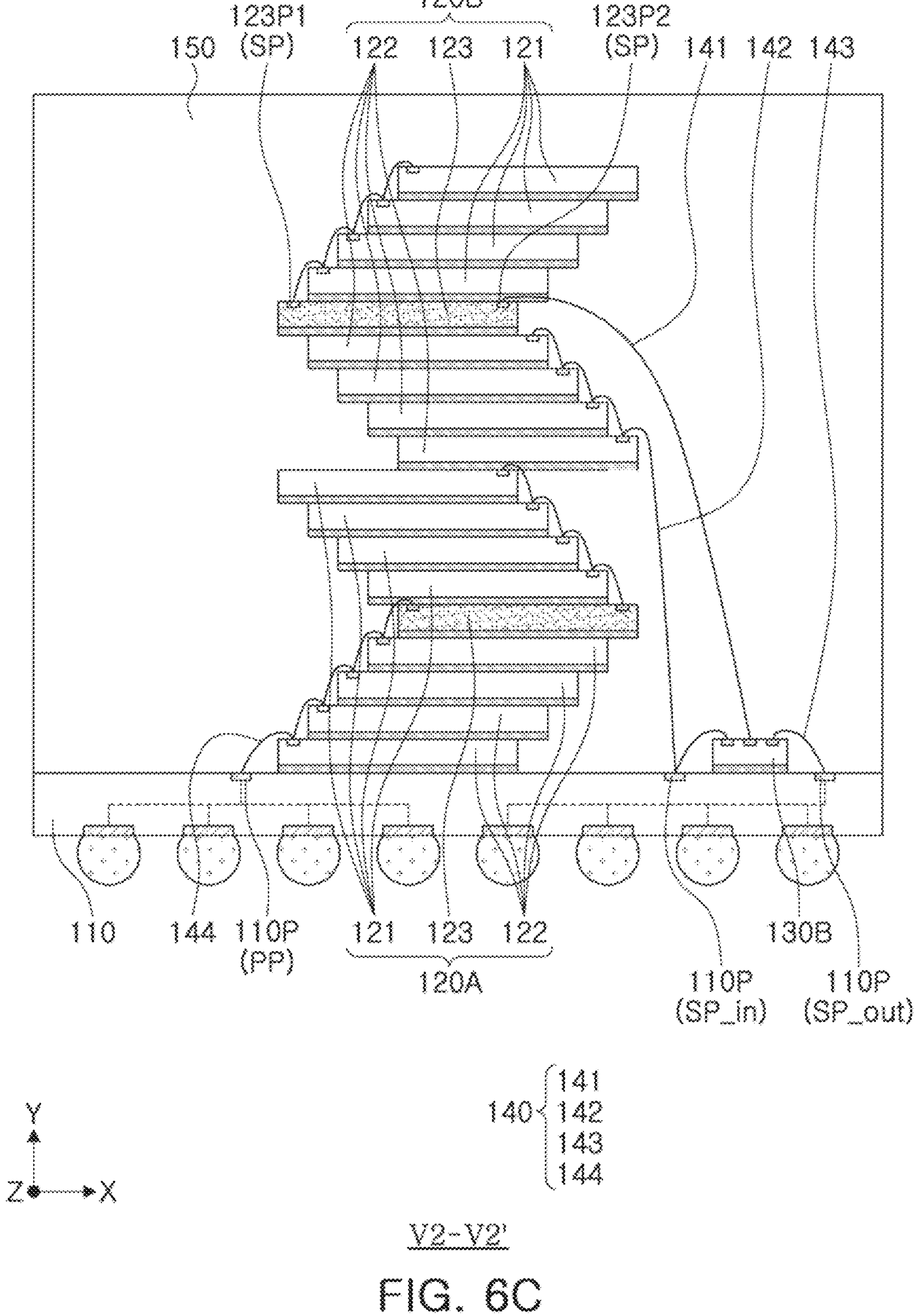
FIG. 6C is a cross-sectional view taken along line V2-V2' of FIG. 6A.

FIG. 6A is a cross-sectional view of a semiconductor package 100E according to an example embodiment of inventive concepts, FIG. 6B is a cross-sectional view taken along line V1-V1' of FIG. 6A, and FIG. 6C is a cross-sectional view taken along line V2-V2' of FIG. 6A.

Referring to FIGS. 6A to 6B, the semiconductor package 100E of an example embodiment may have the same or similar features as those described with reference to FIGS. 1 to 5C, except that the semiconductor package 100E includes a plurality of chip structures 120A and 120B and a plurality of controller chips 130A and 130B, but a disposition of the plurality of chip structures 120A and 120B and the plurality of controller chips 130A and 130B is different from the example embodiment illustrated in FIGS. 4A to 5C.

In this embodiment, the first chip structure 120A and the second chip structure B may be vertically stacked on the substrate 110. The upper chip stack 121 and the lower chip stack 122, and the buffer chip 123, constituting the first chip structure 120A and the second chip structure 120B may be stacked in the form illustrated in FIGS. 3A to 3C, respectively. The first controller chip 130A and the second controller chip 130B may be disposed adjacently to the first chip structure 120A and the second chip structure 120B, respectively. For example, the first controller chip 130A and the second controller chip 130B may be disposed with the first chip structure 120A and the second chip structure 120B interposed therebetween. As described above, a dispositional form of the first chip structure 120A, the second chip structure 120B, the first controller chip 130A, and the second controller chip 130B may be variously modified.

As set forth above, according to example embodiments, a semiconductor package having an improved response speed may be provided by inserting a buffer chip between a plurality of vertically stacked semiconductor chips.

One or more of the elements disclosed above may include or be implemented in processing circuitry such as hardware including logic circuits; a hardware/software combination such as a processor executing software; or a combination thereof. For example, the processing circuitry may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While example embodiments have been shown and described above, it will be apparent to those skilled in the art that modifications and variations could be made without departing from the scope of inventive concepts as defined by the appended claims.

What is claimed is:

1. A semiconductor package, comprising:

a substrate including bonding pads;

at least one controller chip on the substrate;

at least one chip structure on the substrate and adjacent to the at least one controller chip, the at least one chip structure including a buffer chip, an upper chip stack on an upper surface of the buffer chip, and a lower chip stack on a lower surface of the buffer chip, the lower surface of the buffer chip being opposite the upper surface of the buffer chip, the buffer chip including buffer pads on the upper surface of the buffer chip, the upper chip stack including upper semiconductor chips with first connection pads, and the lower chip stack including lower semiconductor chips with second connection pads;

a bonding wire structure electrically connecting the substrate, the at least one controller chip, and the at least one chip structure; and an encapsulant encapsulating the at least one controller chip and the at least one chip structure, wherein the upper chip stack is connected to the at least one controller chip via the buffer chip, and the lower chip stack is connected to the at least one controller chip via the substrate.

2. The semiconductor package of claim 1, wherein the bonding wire structure comprises an upper wire, a lower wire, and a first connection wire, the upper wire connects some of the first connection pads of the upper chip stack that are adjacent to each other, some of the buffer pads of the buffer chip, and the at least one controller chip, the lower wire connects some of the second connection pads of the lower chip stack that are adjacent to each other, some of the bonding pads of the substrate, and the at least one controller chip, and the first connection wire connects the at least one controller chip and some of the bonding pads of the substrate.

3. The semiconductor package of claim 2, wherein the upper wire and the lower wire are electrically insulated from each other.

4. The semiconductor package of claim 2, wherein the some of the first connection pads, the some of the buffer pads of the buffer chip, the some of the second connection pads, and the some of the bonding pads of the substrate comprise a signal pad.

5. The semiconductor package of claim 2, wherein the first connection pads of the upper chip stack include other first connection pads and the some of the first connection pads, the buffer pads of the buffer chip include other buffer pads and the some of the buffer pads, the second connection pads of the lower chip stack include other second connection pads and the some of the second connection pads, the bonding pads of the substrate include other bonding pads and the some of the bonding pads, the bonding wire structure further comprises a second connection wire, and the second connection wire connects the other first connection pads that are adjacent to each other the other buffer pads, and the other second connection pads that are adjacent to each other, and the other bonding pads.

6. The semiconductor package of claim 5, wherein the other first connection pads, the other buffer pads, the other second connection pads, and the other bonding pads comprise a power/ground pad.

7. The semiconductor package of claim 1, wherein the buffer pads comprise first buffer pads and second buffer pads, the first buffer pads and the second buffer pads are arranged on a first side of the buffer chip and electrically connected to each other, the upper semiconductor chips are stacked such that the first connection pads are adjacent to the first side of the buffer chip and the first buffer pads, the second buffer pads, and the first connection pads are exposed upwardly, and the lower semiconductor chips are stacked such that the second connection pads are adjacent to the first side of the buffer chip and the second connection pads are exposed upwardly.

8. The semiconductor package of claim 7, wherein the at least one controller chip is adjacent to the first side of the buffer chip.

9. The semiconductor package of claim 1, wherein the buffer pads comprise first buffer pads on a first side of the buffer chip and second buffer pads on a second side of the buffer chip, the second side of the buffer chip is opposite to the first side of the buffer chip, the second buffer pads are electrically connected to the first buffer pads, the upper semiconductor chips are stacked such that the first connection pads are adjacent to the first side of the buffer chip, and the first buffer pads and the first connection pads are exposed upwardly, and the lower semiconductor chips are stacked such that the second connection pads are adjacent to the second side of the buffer chip and the second connection pads are exposed upwardly.

10. The semiconductor package of claim 9, wherein the bonding wire structure comprises an upper wire, a lower wire, and a first connection wire, the upper wire connects some of the first connection pads of the upper chip stack that are adjacent to each other, some of the first buffer pads, some of the second buffer pads, and the at least one controller chip, the lower wire connects some of the second connection pads of the lower chip stack that are adjacent to each other, some of the bonding pads of the substrate, and the at least one controller chip, and the first connection wire connects the at least one controller chip and some of the bonding pads of the substrate.

11. The semiconductor package of claim 10, wherein the first connection pads of the upper chip stack include other first connection pads and the some of the first connection pads, the buffer pads of the buffer chip include other first buffer pads, other second buffer pads, the some of the first buffer pads, and the some of the second buffer pads, the second connection pads of the lower chip stack include other second connection pads and the some of the second connection pads, the bonding pads of the substrate include other bonding pads and the some of the bonding pads, the bonding wire structure further comprises a second connection wire, the second connection wire connects the other first connection pads that are adjacent to each other, the other first buffer pads, the other second buffer pads, the other second connection pads that are adjacent to each other, and the other bonding pads of the substrate.

12. The semiconductor package of claim 9, wherein the at least one controller chip is adjacent to the second side of the buffer chip.

13. The semiconductor package of claim 1, wherein the at least one chip structure comprises a plurality of chip structures on the substrate horizontally or vertically, and the at least one controller chip comprises a plurality of controller chips corresponding to the plurality of chip structures.

14. A semiconductor package, comprising:

a substrate;

at least one controller chip on the substrate;

at least one chip structure on the substrate, the at least one chip structure including a buffer chip, an upper chip stack on the buffer chip, and a lower chip stack below the buffer chip;

an upper wire electrically connecting the upper chip stack, the buffer chip, and the at least one controller chip;

a lower wire electrically connecting the lower chip stack and the at least one controller chip;

a connection wire electrically connecting the at least one controller chip to the substrate; and connection bumps below the substrate, the connection bumps being electrically connected to the at least one controller chip and the at least one chip structure.

15. The semiconductor package of claim 14, wherein the lower wire is connected to the at least one controller chip via the substrate.

16. The semiconductor package of claim 14, wherein the lower wire is electrically insulated from the buffer chip.

17. The semiconductor package of claim 14, wherein the upper chip stack comprises upper semiconductor chips stacked such that respective first connection pads are exposed, and the lower chip stack comprises lower semiconductor chips stacked such that respective second connection pads are exposed.

18. The semiconductor package of claim 17, wherein the upper wire connects some of the respective first connection pads of each of the upper semiconductor chips to the buffer chip and the at least one controller chip, and the lower wire connects some of the respective second connection pads of each of the lower semiconductor chips to the at least one controller chip.

19. A semiconductor package, comprising:

a substrate;

at least one controller chip on the substrate;

at least one chip structure on the substrate, the at least one chip structure including a buffer chip, an upper chip stack on the buffer chip, and a lower chip stack below the buffer chip;

an upper wire electrically connecting the upper chip stack, the buffer chip, and the at least one controller chip, the upper wire including a long wire directly connecting the buffer chip and the at least one controller chip; and a lower wire electrically connecting the lower chip stack and the at least one controller chip.

20. The semiconductor package of claim 19, wherein a level of the buffer chip is higher than a level of the at least one controller chip.

* * * * *